July 2, 1963 T. F. GOSSARD 3,096,466

FIXED FREQUENCY AMPLIFIER

Original Filed Aug. 13, 1953 4 Sheets-Sheet 1

INVENTOR.
THOMAS FISHER GOSSARD

BY Ostrolenk, Faber, Gerb & Soffen
ATTORNEYS

July 2, 1963 T. F. GOSSARD 3,096,466

FIXED FREQUENCY AMPLIFIER

Original Filed Aug. 13, 1953 4 Sheets-Sheet 2

INVENTOR.
THOMAS FISHER GOSSARD

BY Ostrolenk, Faber, Gerb & Soffen
ATTORNEYS

July 2, 1963 T. F. GOSSARD 3,096,466

FIXED FREQUENCY AMPLIFIER

Original Filed Aug. 13, 1953 4 Sheets-Sheet 3

INVENTOR.
THOMAS FISHER GOSSARD

BY Ostrolenk, Faber, Gerb & Soffen

ATTORNEYS

FIXED FREQUENCY AMPLIFIER

INVENTOR.
Thomas Fisher Gossard

BY Ostrolenk, Faber, Gerb & Soffen
ATTORNEYS

United States Patent Office 3,096,466

Patented July 2, 1963

3,096,466

FIXED FREQUENCY AMPLIFIER

Thomas Fisher Gossard, North Hollywood, Calif., assignor to Standard Coil Products Co. Inc., Melrose Park, Ill., a corporation of Illinois Original application Aug. 13, 1953, Ser. No. 374,039, now Patent No. 2,796,470. Divided and this application Apr. 26, 1957, Ser. No. 655,223

1 Claim. (Cl. 317—101)

The present application is a division of application Serial No. 374,039, filed August 13, 1953, now Patent No. 2,796,470 and relates to amplifiers and more particularly it relates to amplifiers operating at a fixed frequency.

Heretofore fixed frequency amplifiers such as I.F. for radio or television reception were assembled and wired in the necessary number of stages directly on the chassis of the set itself. This procedure presents a number of shortcomings.

It is easily seen, in fact, that a considerable number of operations are required to properly wire even a single stage of I.F. amplification. Moreover, when operating at a high frequency, for example 41 mc., as in television, these amplifiers must have the shortest possible interconnecting wires and must be identical to each other. In fact, at these frequencies any slight variation in the respective position of wires or length of wires may cause disturbing changes in the electrical characteristics of the amplifier.

It is also well known that maintenance of such units requires considerable skill since the change of even one of the electrical elements often requires the removal of large numbers of other electrical elements.

Furthermore, in complex apparatus such as communication receivers, transmitters, television sets, etc. the element of space becomes the predominant factor in the overall dimensions of the equipment itself. It is, therefore, necessary to construct amplifiers so that (1) they occupy the smallest possible space, (2) they have the required electrical characteristics, (3) they may be easily replaced and adjusted, (4) the units are perfectly standardized and therefore identical in operation.

The present invention overcomes these difficulties by providing a single stage fixed frequency amplifier wherein the wiring is all done by printed circuit techniques.

One object of the present invention is therefore a single stage amplifier, the wiring of which is obtained by printed circuit techniques.

Another object of the present invention is the provision of means whereby amplifiers may be manufactured to be identical to each other and standardized.

A further object of the present invention is the provision of means whereby a single stage amplifier can be easily removed whenever its operation becomes defective and a second amplifier be substituted in its place.

The present amplifier consists essentially of a dielectric base plate on which, by printed circuit techniques, the wiring diagram of the amplifier is printed. The dielectric base is provided with appropriate openings to permit the placement of the socket of a tube and of any other electrical component, such as trimmer capacitors, disc capacitors or inductive coils.

Lead wires are brought out from appropriate openings located along the edges of the dielectric plate. The complete amplifier assembly is positioned and secured to the chassis of the equipment using such amplifier by means of appropriate extensions mounted on the dielectric plate and when trimmer capacitors are used by the engagement of the capacitor trimming screw with the chassis of the apparatus and the ceramic dielectric of the trimmer capacitor.

In order to connect a single stage of this novel amplifier to the preceding circuitry mounted on the chassis of an apparatus it is only necessary to solder the leads of this amplifier to the circuit preceding and following this particular stage of amplification. Should any electrical component of one of these amplifiers become damaged and the amplifier inoperative, the complete stage can be easily removed and a new one substituted therefor.

Since such amplifiers are all identical to each other no adjustment is necessary when one of them is substituted in place of another.

Whenever a piece of apparatus has more than a single stage of amplification it is also possible to construct, using printed circuit techniques, an amplifier consisting of many stages, all mounted on the same dielectric plate. While this construction is possible, it is not the most economical, since, should the dielectric plate break during the manufacturing process or during the life of the amplifier it will be necessary to remove the complete amplifier, consisting of many stages, and substitute therefor another complete amplifier.

With the present invention, since each stage is wired separately and mounted on a separate dielectric base, it is obvious that the breakage or damage of one of such stages requires the substitution of an identical one and not the substitution of a complete amplifier consisting of many such stages.

The construction of these novel amplifiers may comprise the following steps: A dielectric plate of the correct dimensions is first provided with openings to house the trimmer capacitors and the tube socket. Smaller slots are provided to permit the insertion of disc capacitors. Prior to inserting these capacitors, the dielectric plate is processed by printed circuit techniques so that the proper electrical diagram now appears on one surface of the dielectric plate. Following this all the other electrical elements are mounted on the dielectric plate and the complete structure is then dipped in solder and appropriately cleaned.

With the addition of the tube and screws for the trimmer capacitors, the I.F. amplifier can now be mounted in the piece of equipment of which it is a part.

The foregoing and many other objects of the present invention will become apparent in the following description and drawings in which.

Figures 3A, 3C:
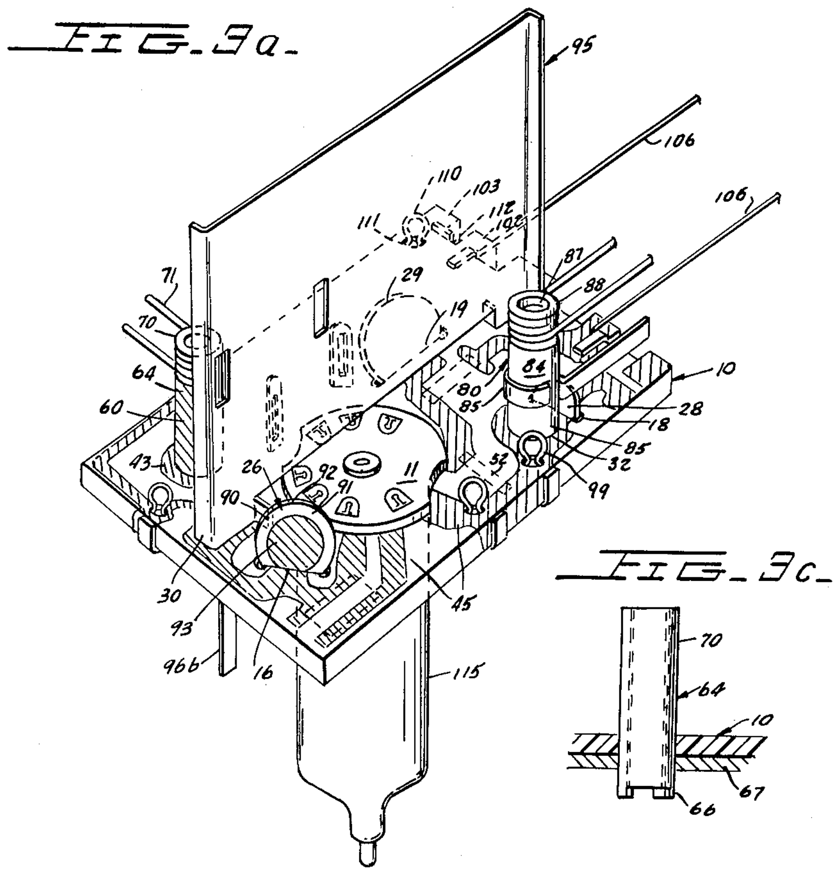

FIGURE 3*a* is a perspective view of one stage of the fixed frequency amplifier of my invention showing the relative positions of the tuning capacitors and the electron tube.

Figure 3B:
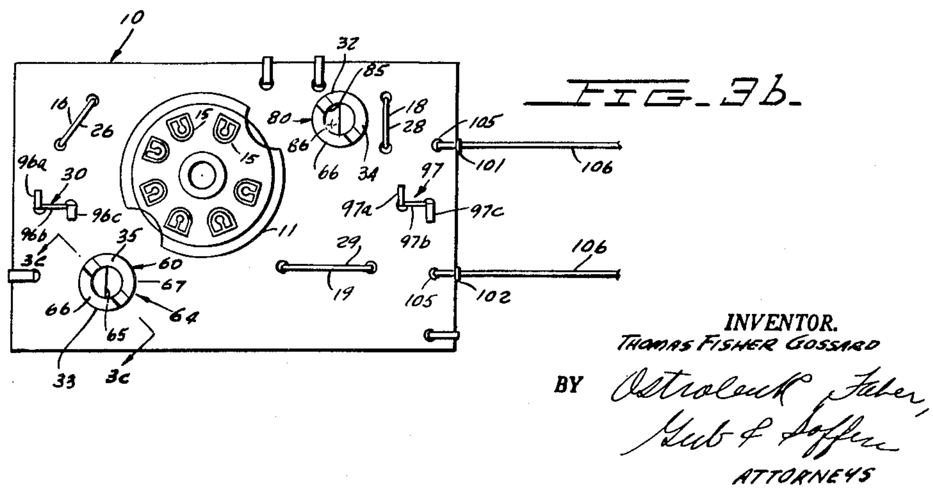

FIGURE 3*b* is a bottom view of the ceramic plate of my invention showing the relative position of the tube socket and ceramic disc capacitors.

FIGURE 3*c* is a detailed view of the coil form and capacitor assembly.

Figure 4:
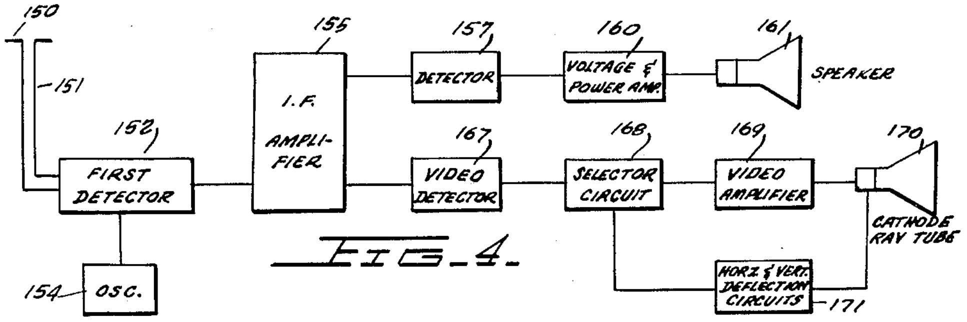

FIGURE 4 is a block diagram of a television receiver in which my novel amplifier may be used.

Figure 5:
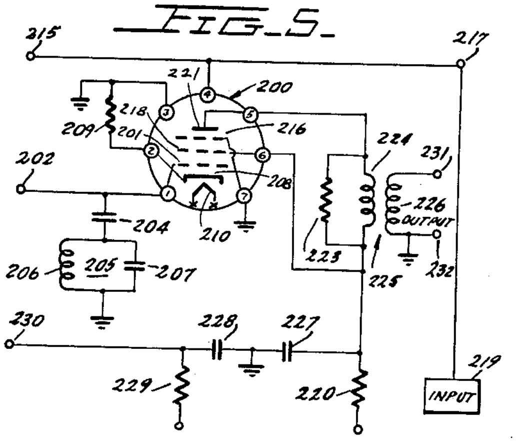

FIGURE 5 is a circuit diagram of a second I.F. amplifier.

Figure 6:
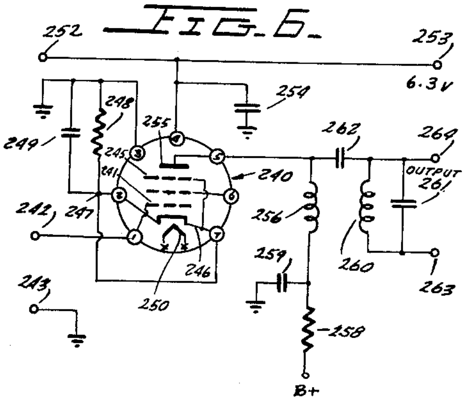

FIGURE 6 is a circuit diagram of a third I.F. amplifier

Figures 7, 8:
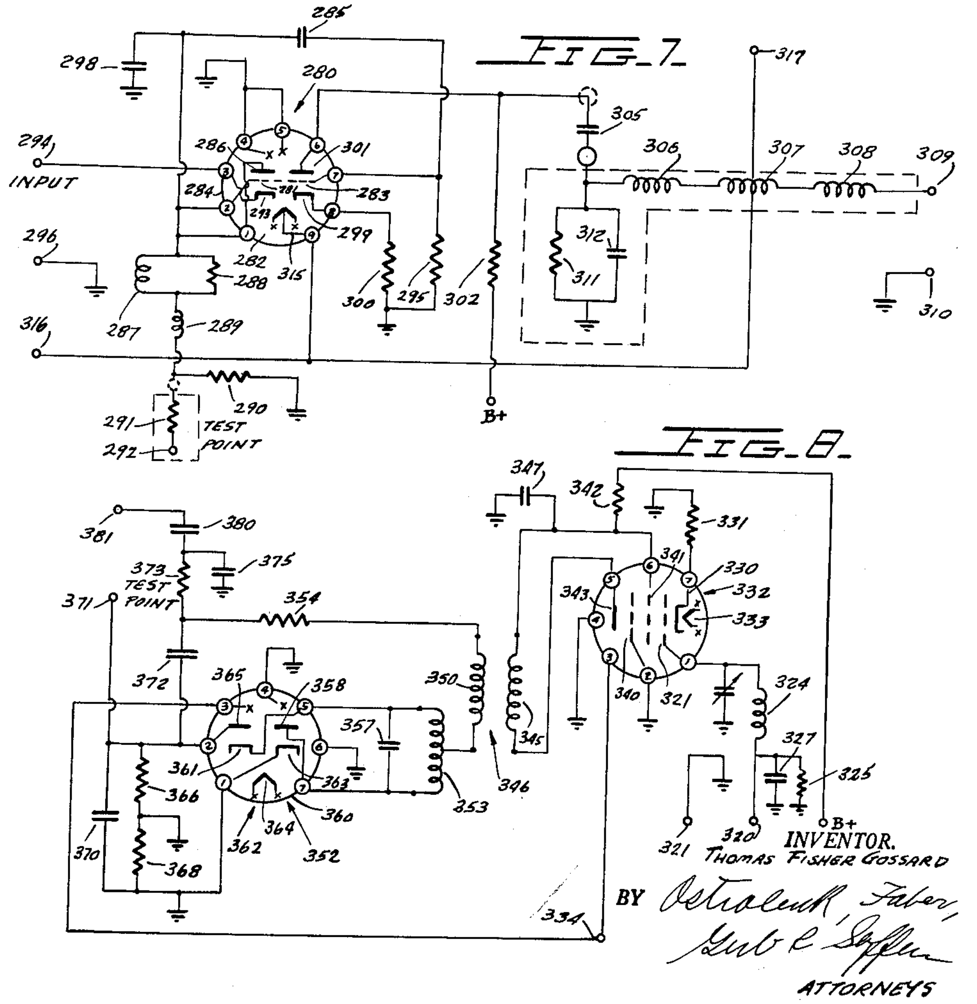

FIGURE 7 is a schematic diagram of a video detector and the first sound I.F. amplifier FIGURE 8 is a schematic diagram of a second I.F. amplifier and ratio detector.

Figure 9:
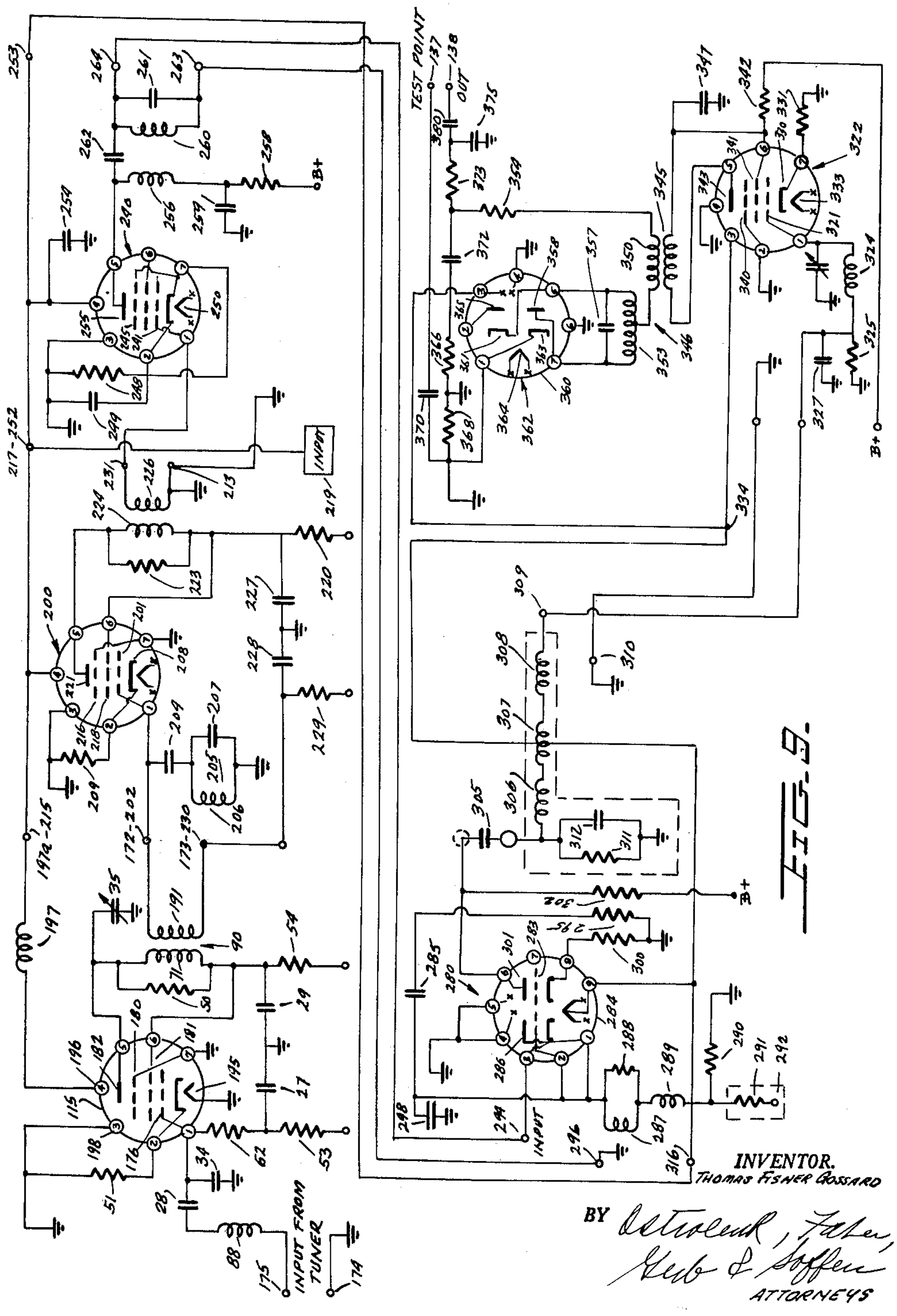

FIGURE 9 is a circuit diagram of the complete I.F. amplifier of a elevision receiver consisting of the circuits shown in FIGURES 2, 5, 6, 7 and 8.

Figure 1:
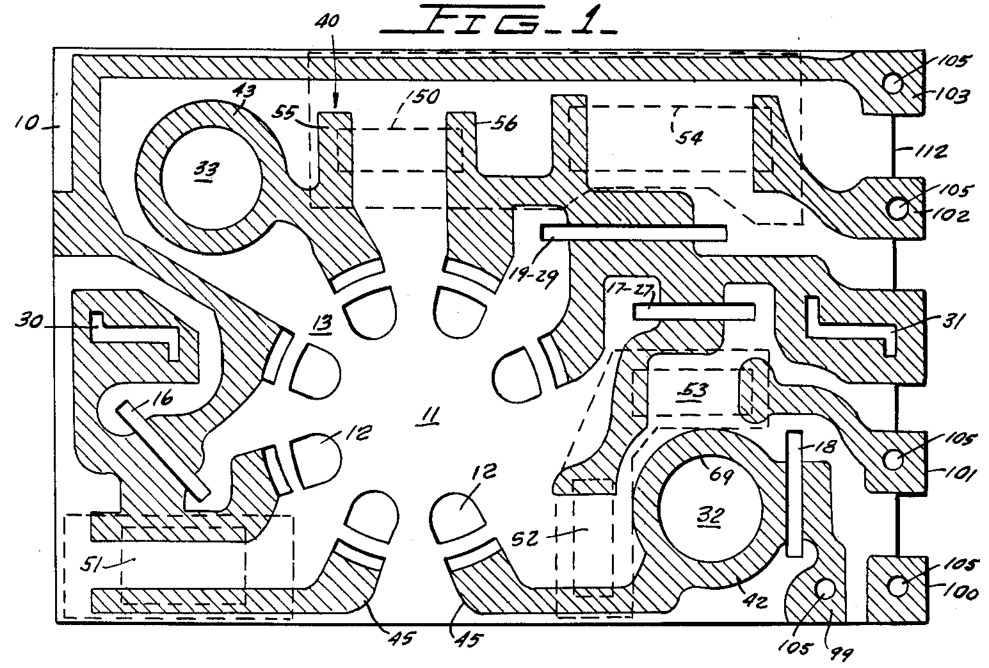
FIGURE 1 is a plan view of one printed circuit stage of the fixed frequency amplifier of my invention.

Referring first to FIGURE 1, a ceramic plate 10 which in the present embodiment may be from 1/8 to 5/32" thick is provided with a built-in miniature tube socket 11. Tube socket 11 in this particular embodiment is provided with seven terminals 12 which pass through an area 13 of ceramic plate 10. Terminals 12 are bent on ceramic plate 10 to hold socket 11 in place prior to a dip soldering operation for securing socket 11 on ceramic plate 10.

Thus, after crimping over one end of terminals 12 of socket 11, terminals 12 are dip soldered on ceramic plate 10. The insulating socket itself with the seven clips 15 connected to terminals 12 is on the other side of ceramic plate 10 as can be seen on FIGURE 3*b*.

In addition to opening 13 for tube socket 11, the ceramic plate 10 also has appropriate slots 16, 17, 18, 19 from .020 to .030" thick and from approximately 1/4 to 3/8" long in which (see FIGURE 3*b*) disc type ceramic capacitors 26, 27, 28 and 29 will be inserted after the circuit printing operation.

In addition, ceramic plate 10 is provided with rectangularly shaped slots 30 and 31 aligned and located at each end of ceramic plate 10. Circular openings 32 and 33 are provided for receiving trimmer capacitors 34 and 35, respectively, while rectangular slots 30 and 31, as will be seen hereinafter, serve to receive extensions of a conductive shield.

After providing ceramic plate 10 with the above mentioned slots and openings, an electrical circuit is printed on one surface of ceramic plate 10 using any well-known printed circuit technique. At the end of this printing operation, a silver connecting pattern 40 will be fixedly secured to one surface of ceramic plate 10.

It will be noted that the silver connecting pattern 40 surrounds openings 32 and 33 at 42 and 43 and is also so shaped at 45 that simple electrical connection can be made between terminals 12 of socket 11 and portions 45 of printed circuit 40 by a soldering which, as described herein after, may be of the dip soldering type.

Subsequently printed circuit resistors 50, 51, 52, 53 and 54 are screened on ceramic plate 10 using the standard resistor screening methods so that resistors 50–54 will be positioned between appropriate silver terminals such as terminals 55 and 56 for resistor 50.

Similar terminals are also provided for the other resistors during the screening on ceramic plate 10 of the silver connecting pattern. In this particular embodiment resistor 50 has a magnitude of 15 kilo-ohms; resistor 51, 47 ohms; resistor 52, 8.2 kilo-ohms; resistor 53, 1 kilo-ohm; resistor 54, 330 ohms.

Some care has to be given to providing a length to width ratio on these resistors 50–54 so that they may be screened on the plate with a minimum number of separate screening operations. The spread or ratio between the lowest valued resistor and the highest valued resistor on any one plate such as 10 usually makes it impossible to use the same resistor mix or carbon paint mix to cover all values of resistors required.

In other words, resistors having a low value would be very very short and extremely wide while those having a high value would have to be very long and thin and when a required wattage rating of the resistors is taken into account, it becomes very difficult to screen all resistors with a single screening operation unless, as previously mentioned, they are correctly designed.

In this embodiment a 6CB6 miniature pentode is mounted on socket 11 to complete the circuit of this intermediate frequency amplifier. The insertion of the tube such as 6CB6 and denoted by numeral 115 (see FIGURE 3*a*) into socket 11 imposes a strain upon the connectors 12 through the clips 15 of socket. Such a strain may very easily be transmitted to the silver pattern 40 of ceramic plate 10. Any movement relative to the silver portions 40 and the tube terminals 12, both of which are soldered together, can easily result in the cracking of the solder or even in the lifting of the silver pattern 40 from the ceramic base 10, thus causing an open circuit at the two terminals 12.

By crimping, as previously described, terminals 12 of socket 11 and then soldering by dip solder to the ceramic plate 10, the above-mentioned problem is overcome. In addition, on eyeletting operation on the ceramic plate 10 is used to prevent possible breakage of the steotite or ceramic plate 10 during the eyeletting operation.

The slots such as 16, 17, etc. which serve to receive disc type capacitors 26, 27, etc., respectively will either be tapered and become smaller in width as they go through the thickness of the plate 10 or should have a slight step near the bottom of the plate 10 so that these discs 26, 27, etc. will not fall through when they are placed into slots 16, 17, etc. In other words, approximately one-half of each disc 26, 27 etc. should ride above the printed surface 40 of the plates 10 such as shown in FIGURE 3*a* so that a good solder fillet can be obtained.

Appropriately designed jigs are used to temporarily hold these disc capacitors 26, 27, etc. in place during the solder dip operation in as much as otherwise the steotite discs 26, 27, etc. will float upon the solder and will actually rise out of these slots 16, 17 if they are not temporarily held until the solder has subsequently cooled and firmly secured them in place in slots 16, 17, etc.

In addition, a cylinder 60 is introduced in the opening 33. Ceramic cylinder 60 is provided with a silvered portion 64 which acts as one plate of trimmer capacitor 35. The other plate of trimmer capacitor 35 consists of a conductive screw 65 engaging ceramic cylinder 60 from the lower surface of ceramic plate 10. Screw 65 in addition to engaging ceramic cylinder 60 also engages a washer 66 of spring material having a slight curvature so that when chassis 67 (see FIGURE 3*c*) is interposed between ceramic cylinder 60 and washer 66 by rotation of screw 65 it is possible to secure ceramic cylinder 60 and, therefore, capacitor 35 to the chassis 67 of this novel fixed frequency amplifier.

Silvered portion 64 which is approximately centrally located along ceramic cylinder 60 faces and is in contact with portion 43. The ceramic dowel 60 is then dip soldered to place a fillet of solder and thus connect the silvered area 43 surrounding hole 33 to the silvered surface 64 on the dowel 60.

It is necessary to point out that dowell 60 is internally threaded as in a normal ceramic trimmer capacitor in order to receive the above-mentioned trimming screw 65.

It will also be noted that plate 10 on its back side at the locations of holes 33 and 32 is formed into a slope such as at 69 so that ceramic dowel 60 will stand vertically; that is, the axis of the dowel 60 will be normal to the base or surface of ceramic plate 10.

Trimmer screw 65 is in this case a 632 screw and it forms the vertical portion of trimmer capacitor 35 making connection to ground or chassis plate 67 on which this stage intermediate frequency amplification is mounted.

Ceramic dowel 60 which forms the tuning or variable element of this intermediate frequency amplifier is made long enough so that one extension 70 is not coated with silver paint as portion 64. This additional length of ceramic dowel 60 serves as a coil form for the coil 71 of the tuning circuit of this fixed frequency amplifier.

Coil 71 may either be wound directly upon portion 70 of dowel 60 before dowel 60 is inserted in opening 33 of plate 10 and before soldering or coil 71 can be wound in a separate self-supporting coil form (not shown) and subsequently slipped over dowel 60 to occupy portion 70 after the solder dip operation.

Dowel 80 is inserted in opening 32 of plate 10 and is similar to dowel 60; that is, dowel 80 is provided with a silver portion 84, with an internally threaded portion 85 engaged by the trimming or tuning screw 86. Silvered portion 84 faces silvered portion 42 of the silvered printed circuit 40 and is soldered thereto during the dip soldering operation.

Through engagement of the head of screw 86 with a spring washer 66 and chassis 67, it is possible to secure also dowel 80 on chassis 67 and, therefore, plate 10. Dowel 80 is also provided with a non-silvered portion 87 on which another coil 88 is wound to form another electrical component for a tuned circuit of this intermediate frequency amplifier.

Coils 71 and 88 when wound on dowels 60 and 80, respectively, before the dip solder operation have their connections made with the other parts or electrical components of this novel intermediate frequency amplifier during the dip solder operation. If the pre-wound coils 71 and 88 are placed on portions 70 and 87 of dowels 60 and 80 after the soldering operation, then a subsequent connection of the leads of coils 71 and 88 to the rest of the electrical circuit becomes necessary.

As for the dip soldering operation on the ceramic plate 10, it was found that it may be performed with the usual methods and that a plate such as 10 can withstand the thermal shock quite successfully during immersion of plate 10 and its electrical component in the solder bath, but before the solder dip operation ceramic disc capacitor 26, 27, 28, 29 are introduced in their respective openings of slots 16, 17, 18 and 19. Ceramic discs 26–29 are of a well-known shape and consist of a ceramic disc 90 having both surfaces 91 and 92 silvered at 93.

Again here after the ceramic disc capacitors have been put into place, the solder dip operation will electrically connect silver portion 93 of ceramic capacitors 26–29 to the silvered portion of printed circuit 43 as shown in FIGURE 3*a*.

Actually, following the printing operation of the silver screen pattern 40 on ceramic plate 10, the flat surface on which the printed circuit 10 appears must be surfaced after the steotite is fired.

Plates 10 as they come from the kiln do not have otherwise sufficient smoothness and flatness to give consistent resistor values in the screening operation for resistors 50 to 54. The silver patterns 40 are also much more clean and clear when the surface of ceramic plate 10 has been ground after firing the steotite in a manner well-known in the art.

Separating the input trimmer capacitor 34 from the output trimmer capacitor 35 is a conductive shield 95 having two extensions 96 and 97 engaging, respectively, openings 30 and 31 on ceramic plate 10. Extensions 96 and 97 actually consist of three portions. The two outer ones 96*a* and 96*c* after passing through opening 30 are bent in opposite directions to secure shield 95 to a ceramic plate 10.

Similarly, extensions 97*a* and 97*c* after passing through opening 31 are bent in opposite directions as can be seen in both FIGURES 1 and 3. The center portions 96*b* and 97*b* extend beyond the opposite side of the surface of ceramic plate 10 on which circuit 40 is printed and extensions 96*b* and 97*b* serve to additionally secure base plate 10 to chassis 67 of the equipment or apparatus on which this intermediate frequency amplifier is used.

More specifically, chassis 67 must be provided with appropriate openings through which extensions 96*b* and 97*b* of shield 95 can be passed and soldered thereon.

It will be noted that on one edge of ceramic plate 10 are also five terminals 99, 100, 101, 102, 103 obtained from the silver pattern 40 of the printed circuit. Each of these terminals 99–103 has a central opening 105 which extends through the ceramic base 10 and to which lead wires 106 are wrapped through teminals 99 to 103 through their openings 105 to form leads extending from the fixed frequency amplifier units.

Insulating spaghetti (not shown) is subsequently placed along leads 106 protruding from individual units 10 and the wires are then used to interconnect and to reach the voltage supply (not shown) on the chassis proper 67. In addition to connecting this stage of amplification to the voltage supply, these leads 106 also connect the same amplifier to the desired bias voltages mounted on chassis 67 and not shown in FIGURES 1 and 3 but shown schematically in FIGURE 2 where the voltage supply is denoted by B+ and the filament supply by EF.

Instead of terminal portions 99 to 103 it is possible to use actual terminals formed by a circularly wound wire as shown at 110 of FIGURE 3. In fact, in FIGURE 3 small terminals 110 are secured in any suitable way, for example by soldering, to slots 111 near the edge 112 of ceramic base plate 10.

The use of such terminals 110 instead of the previously mentioned contact portions 99–103 makes these units more adaptable for changing a lay-out inasmuch as to have leads such as 106 means that they have to be precut to some predetermined length and any change in the lay-out of the I.F. strip would then require leads 106 of different lengths. In addition, by providing terminals 110 instead of leads 106 one avoids the problem of keeping leads 106 with the correctly colored spaghetti 108 which is generally used for easier identification.

The use of terminals 110 would make these units more universally adapted to a customer buying the units and installing them himself in his own chassis, possibly without having these I.F. strips as a separate sub-assembly. For example, they can be installed in the main chassis of a television receiver if appropriate perforations in the chassis were made for them.

It is necessary to point out that extensions 96*b* and 97*b* which as previously mentioned are soldered to the chassis 67 and belong to shield 95 also serve as grounding means on chassis 67 for the electrical circuit 40 mounted on ceramic base plate 10. It will be noted, in fact, that shield 95 is connected to the ground portion of silvered circuit 40.

Figure 2:
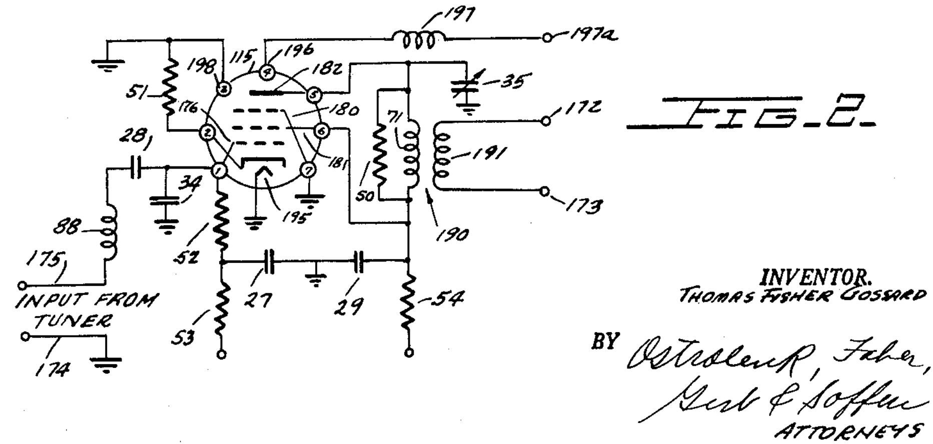
FIGURE 2 is the electrical circuit diagram for the fixed frequency amplifier of FIGURE 1.

Referring now to FIGURE 2 showing the electrical circuit of the intermediate frequency amplifier whose physical construction was described in connection with FIGURE 1 and slightly modified in FIGURE 3, the tube used in this particular embodiment is a 6CB6 pentode amplifier which is here used as the intermediate frequency amplifier tube and must operate at the intermediate frequency of a television receiver, namely 41 megacycles, since this particular embodiment is constructed for use in connection with television receivers.

Tube 115 (6CB6) is of the miniature type and its pins are positioned and engaged by clips 15 of socket 11 so that tube 115 is mounted on the side of ceramic base 10 opposite to the one on which circuit 40 is printed.

The amplifier shown in FIGURE 2 and described hereinafter may be used as previously mentioned in the circuit of a television receiver as shown diagrammatically in FIGURE 4.

In FIGURE 4 the antenna 150 is connected through transmission line 151 to the input of a first detector or converter. Coupled to the input of the first detector 152 is also the local oscillator 154.

The output of the first detector 152 is introduced into the I.F. amplifier 155. The I.F. amplifier 155 has its output connected to a detector 157 for sound and the output of this detector, after being amplified by appropriate voltage and power amplifiers 160, is applied to the coil of a speaker 161.

Similarly, the I.F. amplifier 155 is connected to a video detector 167. The output from the video detector 167 is a signal which corresponds exactly to the video detector generated by the pick-up device at the television transmitter together with synchronizing impulses and any corrected signals inserted at the monitory amplifier.

Thus, the output from the video detector 167 is introduced into the synchronizing selector circuit 168 and then amplified by the video amplifier 169 and introduced into the cathode ray tube 170.

At the same time, signals from the synchronizing selector circuit 168 are applied to the horizontal and vertical deflection circuits 171, the output of which is applied to cathode ray tube 170 in a well-known manner.

It is necessary to point out that the amplifier described hereinafter and shown in FIGURE 2 may be used as one of the stages in either the audio I.F. amplifier 155 or the video I.F. amplifier 156. The connections of such an I.F. amplifier to first detector 152 and either second detector 157 or second detector 167 are well-known in the art and, therefore, will not be described in detail.

Returning now to FIGURE 2 showing the electrical circuit diagram of my novel intermediate frequency amplifier, the output from first detector 152 is applied through terminal lead 175 to input coil 88. Input coil 88 is connected also to the grid 176 of tube 115. The trimmer capacitor 34 is connected between grid 176 and ground.

Cathode 178 of tube 115 is connected to ground through the cathode resistor 51. Suppressor grid 180 is connected directly to ground, while screen grid 181 is connected to the B+ supply through a dropping resistor 54.

Plate 182 is connected also to the B+ supply through the previously mentioned resistor 54 in series with the parallel circuit consisting of resistor 5 and coil 71 which is the primary winding of I.F. transformer 190. Plate 182 is bypassed to ground by trimmer capacitor 35. Secondary winding 191 of output I.F. transformer 190 is wound around coil 71 as can be seen in FIGURE 3.

Grid 176 is also connected to the A.G.C. lead 192 through series resistances 52 and 53. To each connecting point between resistances 52 and 53 is connected capacitance 27, the other side of which is grounded.

Similarly, capacitance 29 connects the connecting point between resistor 54 and resistor 50 to ground. Filament 195 is connected to ground on one side and to tube pin 196 which in its turn is connected to the filament supply EF through a radio frequency choke 197. An unused pin 198 is connected to ground.

It is now possible to describe the operation of this novel intermediate frequency amplifier.

The signal from the tuner or first detector 152 is applied across terminal 175 and ground. This signal at 41 megacycles, that is the intermediate frequency of television receivers, is amplified by tube 115 so that its amplified signal appears across the terminals of output transformer 190.

The tube is provided with a D.C. supply, B+ and a 6.3 volt filament supply. In addition, grid 176, as previously mentioned, is connected to the automatic gain control circuit denoted in the drawing by A.G.C. This automatic gain control circuit may be of any known type and may be connected also to the other stages of amplification at the intermediate frequency.

While the first I.F. amplifier of the television receiver was described above in its novel form, it will now be obvious to these skilled in the art that circuits such as those shown in FIGURES 5, 6, and 7 may be obtained in printed from by performing small variations on the printed circuit shown in FIGURES 1, 3a and 3b.

More specifically, FIGURE 5 shows the electrical circuit diagram of the second I.F. amplifier of a television receiver which, as mentioned above, may also be obtained in printed form by performing the necessary modifications on the printed circuit shown in FIGURE 1.

The second I.F. amplifier consists of a 6CB6 tube here denoted by numeral 200 having its grid 201 connected to a terminal 202 and to ground through a capacitor 204 in series with the parallel circuits 205 consisting of inductance 206 and capacitance 207.

Suppressor grid 216 is connected directly to ground, while screen grid 218 is connected to the B+ supply through a dropping resistance 220. Connected between plate 221 and screen grid 218 is a parallel circuit consisting of the plate load resistance 223 and the primary winding 224 of the I.F. transformer 225. The secondary winding 226 of I.F. transformer 225 is connected to ground on one side and on the other side to utilization circuits such as those described in connection with FIGURE 4.

Connected to the common point of resistance 220 and parallel combination 223—224 is a capacitance 227 for by-passing high frequencies to ground. Also connected to ground is a capacitance 228 with its high side connected to resistance 229 to which is connected in a manner well-known in the art the A.G.C. voltage when the I.F. amplifier is in operation and connected in the circuit of the television receiver.

The high side of capacitance 228 is also connected to a terminal 230 to which other circuits of the television receiver can be connected.

The above amplifier will, therefore, amplify signals applied between terminal 202 and ground and cause the amplified signal to appear across the secondary winding 226 of the output I.F. transformer 225.

As previously mentioned, the rearrangement necessary for changing the structure shown in FIGURE 1 and corresponding to the schematic circuit diagram shown in FIGURE 2 into a structure for physically reproducing the electrical circuit of FIGURE 5 may be easily visualized now by persons skilled in the art.

Similarly, by slight modification of the structure shown in FIGURE 1 it is possible to reproduce the third I.F. amplifier shown in FIGURE 6 in a printed circuit form. The third I.F. amplifier shown in FIGURE 6 consists of a 6AG5 tube denoted by numeral 240 having its grid 241 connected to a terminal 242. The corresponding terminal 243 is connected to ground.

The suppressor grid 245 is tied to the cathode 246 internally in tube 240, and cathode 246 is connected on both sides to a common point 247 biased above ground by means of cathode resistor 248 by-passed by capacitance 249. One side of filament 250 is connected directly to ground, the other side to terminals 252 and 253, one of which is connected to a 6.3 volts filament supply. The latter terminal or filament supply is provided with a by-pass capacitance 254 for by-passing to ground high frequency signals.

The plate 225 of tube 240 is connected to the B+ supply through a primary winding 256 of output I.F. transformer 257 in series with a load resistor 258. Load resistor 258 is by-passed to ground by capacitance 259. The secondary winding 260 of output I.F. transformer 257 is tuned by means of capacitance 261 connected in parallel with transformer 257. A coupling capacitor 262 is connected between primary winding 256 and secondary winding 260 of transformer 257. Secondary winding 260 shunted by capacitance 261 is connected to ground on one side and to terminals 263. The high side of secondary 260 is connected to a terminal 264.

Thus when an I.F. signal is applied between terminals 242 and 243 of the above I.F. amplifier, an amplified signal will appear across terminals 264 and 263.

Finally, referring to FIGURE 7, it will there be seen that even such complex circuits as a video detector and first sound I.F. amplifier may be easily reproduced in printed circuit form by again making slight modifications over the structure shown in FIGURE 1.

Again here since such modifications will be obvious after the description of FIGURES 1 and 2, such a physical embodiment is not reproduced herein.

As for the electrical circuit of the video detector and first sound I.F. amplifier shown in FIGURE 7, a double triode 12AU7 denoted by numeral 280 is there used as a detector and amplifier.

More specifically, the grid 281 of the first half section or first triode 282 is connected to grid 283 and to ground through a capacitor 298. Grid 281 of the first triode 282 is also connected to the plate 286 of triode 282 and to a parallel circuit consisting of inductance 287 and resistance 288.

In series with this parallel combination 287—288 is an inductive coil 289 connected to ground through a resistance 290. The high side of resistance 290 is also connected to another resistance 291 at the end of which is a terminal 292 which serves as a test point for this electrical circuit. Cathode 293 of triode section 282 is connected to the input high terminal 294, while its corresponding terminal 296 is connected to ground.

Thus, the triod section 282, is really connected to form essentially a diode detector circuit for detecting signals applied across terminals 294 and 296. These signals are applied through capacitance 285 to grid 283 of the second triode section 289. The cathode 299 of section 284 is connected to ground through a cathode resistor 300 while its plate 301 is connected to the B+ supply through a load resistor 302.

Plate 301 is also connected to an output circuit consisting of coupling capacitance 305 in series with three series connected coils 306, 307 and 308. Coil 308 is connected to an output terminal 309 while its corresponding terminal 310 is grounded. The common point of capacitor 305 and inductance 306 is connected to ground.

Thus, when an amplified I.F. signal is applied across terminals 294, 296 of the video detector and first sound I.F. amplifier shown in FIGURE 7, it will be possible to obtain the desired detected video signal and an amplified output signal for the sound accompanying the above mentioned video signal.

The filament 315 has the center connected to terminals 316 and 317 while its side terminals are connected to ground.

Referring now to FIGURE 8 which shows the stage subsequent to the first sound I.F. namely the second sound I.F. amplifier and ratio detector, it will there be seen that the signal output from the first sound I.F. amplifier appearing across terminals 309 and 310 of FIGURE 7 is applied across the input terminals 320 and 321, respectively. Terminal 320 (see FIGURE 8) is connected to grid 321 of pentode 322 through a series inductance 324. Terminal 320 is also connected to ground through a grid leak resistor 325 by-passed by a capacitance 327.

A variable capacitance 329 is connected between grid 321 and ground. The other terminal 321 is connected to ground similarly to contact 310 in FIGURE 7.

Cathode 330 of tube 322 is connected to ground through the cathode biasing resistor 331. The filament 333 is connected on one side to ground and on the other to terminal 334 to which as described hereinafter is connected the filament supply of 6.3 volts.

The suppressor grid 340 is connected directly to ground, while the screen grid 341 is connected to the B+ supply through a dropping resistor 342. The plate 343 of tube 322 is connected to the output coil 345 of output transformer 346. Coil 345 is connected to ground through a capacitance 347. Inductive winding 345 is also connected to the dropping resistor 342 and thence to the B+ supply.

The secondary winding 350 of output transformer 346 is connected to the ratio detector consisting of a double diode tube 6AL5 denoted by numeral 352. More specifically, the secondary winding 350 is connected on one side to an intermediate point of winding 353 and on the other side to a resistance 354. Resistance 354 is connected to a connecting point 355 to which, as described hereinafter, are connected other electrical elements.

Winding 353 is tuned by means of a capacitance 357 and is also connected on one side to plate 358 of diode section 360 of tube 352. The other side of winding 353 is connected to the cathode 361 of the second section 362.

By providing the intermediate connection between winding 350 and winding 353 it is possible then to apply a balanced signal to tube 352, more specifically a balanced signal between cathode 361 of section 362 and plate 358 of section 360 of double diode structure 352.

The cathode 363 of first section 360 is connected to ground while plate 365 of the second half section is connected to a resistance 366 having its other side connected to ground. A second resistance 368 is connected between the previously mentioned resistance 366 and ground.

In parallel with the series combination of resistances 366 and 368 is the capacitance 370. In addition, plate 365 of the second section 362 is connected to a terminal 371 which serves as a test point for the above mentioned circuit. In addition, plate 365 is connected to the previously mentioned common point 355 through a capacitance 372. Also connected to the common point 355 is a resistance 373 by-passed to ground by capacitance 375. The other side of resistance 373 to which capacitance 375 is connected, is provided with a capacitance 380 to which the output terminal 381 is connected. Thus, the sound intermediate frequency signal applied between terminals 320 and 321 of the second sound I.F. amplifier will be amplified by tube 322 in conjunction with the previously mentioned circuits and applied in balanced form to the double diode ratio detector 352, the output of which will appear between output terminal 381 and ground.

The circuits described in FIGURE 8 may also be constructed in a form similar to that shown in FIGURE 1, thus obtaining an individual strip containing the second sound I.F. amplifier and the ratio detector.

It is now evident that the electrical circuits described in FIGURES 2, 5, 6, 7 and 8 each mounted in printed circuit form on an individual strip of the kind shown in FIGURE 1 form when connected to each other a complete I.F. amplifier for both video and sound. This may be seen in FIGURE 9 which shows the above described circuits as part of a television receiver.

More specifically, the above described circuit corresponds to elements 155, 157 and 167 of the block diagram of FIGURE 4.

Referring now to FIGURE 9, it is there seen that when the circuits of FIGURES 2, 5, 6, 7, and 8 are connected together, the input terminals of FIGURE 2, namely terminal 175 and its corresponding ground terminal 174 are connected to the output of the first detector 152 which together with local oscillator 154 forms what is generally known as the input tuner of a television set.

The output of the television tuner 152—154 is thus applied to the first I.F. amplifier described in detail in connection with FIGURE 2. The output terminals 172 and 173 of the first I.F. amplifier 115 connected across the secondary winding 191 of transformer 190 are shown in FIGURE 9 connected to the input terminals 202 and 230, respectively, of the second I.F. amplifier 200.

Similarly, the output terminals 231 and 232 connected across the secondary winding 226 of I.F. transformer 225 at the output of the second I.F. amplifier 200 are connected to the input terminals of the third I.F. amplifier, namely terminals 242 and 243 respectively.

The output terminals 263 and 264 of the third I.F. amplifier are connected, respectively, to terminals 296 and 294 of the video detector and first sound I.F. amplifier. The output from the video detector obtained across resistance 290 is applied in a manner well-known in the art to subsequent amplifiers shown at 168, while the first sound I.F. signal now amplified appears across terminals 309, 310 of the first sound I.F. amplifier 284.

The output terminals 309, 310 of the first I.F. sound amplifier 284 are connected, respectively, to input terminals 320 and 321 of the second sound I.F. amplifier 322 which as described above is mutually coupled to the ratio detector consisting of double diode system 352.

The output from the ratio detector 352 appears between terminal 381 and ground and is applied to well-known stages of sound amplification shown generally at 160.

It will also be noted that the filament supply which previously was described as separate is actually connected to the same filament supply for all the circuits described above. More specifically, filament 195 of tube 115 is connected on one side to ground and on the other side to a choke 197, the other side of which is connected to terminal 197*a*. Terminal 197*a* is connected to terminal 215 of the second I.F. amplifier to provide a filament supply for filament 210 of the second I.F. amplifier tube 200.

Terminal 215 is connected to another terminal 217 and to the 6.3 volts filament supply 219. Terminal 217 is connected to terminal 252 of a third I.F. amplifier tube 240. Terminal 252 is connected to another terminal 253 which is connected to terminal 316 of the video detector and first sound I.F. amplifier stage consisting of tube 280.

Since this stage uses a 12AU7 tube, a filament supply of 12 volts is required. Therefore, terminal 316 is connected to the center point of filament 315 while the two end terminals of filament 315 are connected to ground. Terminal 316 is further connected to terminal 317 which in its turn is connected to a terminal 334 of the second sound I.F. and ratio detector stage consisting of tubes 322 and 352.

To this terminal 334 is connected one side of filament 333 of tube 332 and one side of filament 364 of tube 352. By means of these connections it is possible to use a single filament supply for energizing the filaments for the above described stages of amplification and detection.

In addition, all the previously mentioned B+ supplies may actually be a single one as shown in FIGURE 9. This is obtained by tying all the B+ points together and to a common power supply. In such a case, obviously it will be necessary to use decoupling means and appropriate voltage dropping resistors.

In the foregoing the invention has been described solely in connection with specific illustrative embodiments thereof. Since many variations and modifications of the invention will now be obvious to those skilled in the art, I prefer to be bound not by the specific disclosures herein contained but only by the appended claim.

I claim:

An electrical system containing a printed circuit board with a generally rectangular slot therethrough, two conductive layer sections on the board extending respectively to the opposite longer sides of the slot, a condenser composed of a flat dielectric body wtih a conductive electrode layer on its opposite sides, the thickness of said condenser being proportioned to be held wedged in said slot with its electrode layers in direct conductive contact respectively with the said layer sections and thereby constituting a perpendicular firmly self-mounted component in direct circuit connection in the board, said slot being formed into a slope in which the condenser is wedged to the board in the slot by the tapered configuration and provides a direct conductive connection to the printed circuit.

References Cited in the file of this patent

UNITED STATES PATENTS

| | | |
|---|---|---|
| 2,226,745 | Schrack | Dec. 31, 1940 |
| 2,440,308 | Storck | Apr. 27, 1948 |
| 2,474,988 | Sargrove | July 5, 1949 |
| 2,542,651 | Franklin | Feb. 20, 1951 |
| 2,581,967 | Mitchell | Jan. 8, 1952 |
| 2,650,415 | Kingman | Sept. 1, 1953 |
| 2,707,272 | Blitz | Apr. 26, 1955 |
| 2,769,119 | Martin | Oct. 30, 1956 |
| 2,777,039 | Thias | Jan. 8, 1957 |
| 2,869,041 | De Cola | Jan. 13, 1959 |
| 2,876,402 | Billings | Mar. 3, 1959 |